(12) United States Patent
Neal et al.

(10) Patent No.: US 9,133,542 B2
(45) Date of Patent: Sep. 15, 2015

(54) COATING METHODS AND APPARATUS

(75) Inventors: James W. Neal, Ellington, CT (US); Robert F. Latour, Bolton, CT (US); Benjamin J. Zimmerman, Enfield, CT (US)

(73) Assignee: United Technologies Corporation, Hartford, CT (US)

( * ) Notice: Subject to any disclaimer, the term of this patent is extended or adjusted under 35 U.S.C. 154(b) by 107 days.

(21) Appl. No.: 13/395,499

(22) PCT Filed: Nov. 30, 2010

(86) PCT No.: PCT/US2010/058319
§ 371 (c)(1),
(2), (4) Date: Mar. 12, 2012

(87) PCT Pub. No.: WO2011/066532
PCT Pub. Date: Jun. 3, 2011

(65) Prior Publication Data
US 2012/0196030 A1    Aug. 2, 2012

Related U.S. Application Data

(60) Provisional application No. 61/265,046, filed on Nov. 30, 2009.

(51) Int. Cl.
| | |
|---|---|
| C23C 16/46 | (2006.01) |
| C23C 16/02 | (2006.01) |
| C23C 16/52 | (2006.01) |
| C23C 14/02 | (2006.01) |
| H01L 21/67 | (2006.01) |

(Continued)

(52) U.S. Cl.
CPC ............... *C23C 14/02* (2013.01); *C23C 14/024* (2013.01); *C23C 14/541* (2013.01); *C23C 14/566* (2013.01); *H01L 21/67173* (2013.01); *H01L 21/67213* (2013.01)

(58) Field of Classification Search
CPC ..................... H01L 21/67173; H01L 21/67213
USPC ................................... 118/718, 719
See application file for complete search history.

(56) References Cited

U.S. PATENT DOCUMENTS

| | | |
|---|---|---|
| 4,405,659 A | 9/1983 | Strangman |
| 4,676,994 A | 6/1987 | Demaray |

(Continued)

OTHER PUBLICATIONS

International Search Report and Written Opinion for PCT/US2010/058319, dated Aug. 19, 2011.

(Continued)

*Primary Examiner* — Parviz Hassanzadeh
*Assistant Examiner* — Nathan K Ford
(74) *Attorney, Agent, or Firm* — Bachman & LaPointe, P.C.

(57) ABSTRACT

A coating apparatus comprises a coating chamber for coating the articles. The at least one preheat chamber is coupled to the coating chamber. The at least one loading station has a proximal end connectable to at least one of the preheat chambers when in an installed position at a distal end of the preheat chamber. The loading station further includes a carrier for carrying the articles and a drive system. The drive system is positioned to move the carrier between: a loading/unloading position of the carrier in the loading station; a preheat position of the carrier in the preheat chamber to which the loading station is connected; and a deposition position of the carrier in the coating chamber. A gas source is connected to the preheat chamber.

19 Claims, 7 Drawing Sheets

(51) Int. Cl.
*C23C 14/54* (2006.01)
*C23C 14/56* (2006.01)

(56) References Cited

U.S. PATENT DOCUMENTS

| | | | |
|---|---|---|---|
| 6,060,177 A | 5/2000 | Bornstein et al. | |
| 6,206,973 B1* | 3/2001 | Bailey et al. | 118/718 |
| 6,793,968 B1* | 9/2004 | Reymann | 427/250 |
| 2002/0152961 A1* | 10/2002 | Burns | 118/724 |
| 2003/0203127 A1 | 10/2003 | Bruce et al. | |
| 2004/0018303 A1 | 1/2004 | Bruce et al. | |
| 2004/0086635 A1 | 5/2004 | Grossklaus, Jr. et al. | |
| 2004/0211363 A1* | 10/2004 | Bruce et al. | 118/715 |
| 2008/0153314 A1* | 6/2008 | Hayashida et al. | 438/795 |
| 2009/0148614 A1 | 6/2009 | Buczek et al. | |

OTHER PUBLICATIONS

European Search Report for EP10834025.8, dated Jun. 10, 2013.

* cited by examiner

COATING METHODS AND APPARATUS

CROSS-REFERENCE TO RELATED APPLICATION

Benefit is claimed of U.S. Patent Application Ser. No. 61/265,046, filed Nov. 30, 2009, and entitled "Coating Methods and Apparatus", the disclosure of which is incorporated by reference herein in its entirety as if set forth at length.

BACKGROUND

The invention relates to gas turbine engines. More particularly, the invention relates to application of thermal barrier coatings for gas turbine engines.

Gas turbine engine gaspath components are exposed to extreme heat and thermal gradients during various phases of engine operation. Thermal-mechanical stresses and resulting fatigue contribute to component failure. Significant efforts are made to cool such components and provide thermal barrier coatings to improve durability.

Exemplary thermal barrier coating systems include two-layer thermal barrier coating systems. An exemplary system includes a NiCoCrAlY bond coat (e.g., low pressure plasma sprayed (LPPS)) and a yttria-stabilized zirconia (YSZ) thermal barrier coat (TBC) (e.g., air plasma sprayed (APS)). While the TBC layer is being deposited or during an initial heating cycle, a thermally grown oxide (TGO) layer (e.g., alumina) forms atop the bond coat layer. As time-at-temperature and the number of cycles increase, this TGO interface layer grows in thickness. U.S. Pat. Nos. 4,405,659 and 6,060,177 disclose exemplary systems.

Exemplary TBCs are applied to thicknesses of 5-40 mils (127-1016 micrometer) and can provide in excess of 300° F. temperature reduction to the base metal. This temperature reduction translates into improved part durability, higher turbine operating temperatures, and improved turbine efficiency.

SUMMARY

One aspect of the disclosure involves a coating apparatus for coating articles. The apparatus comprises a coating chamber for coating the articles. The at least one preheat chamber is coupled to the coating chamber. The at least one loading station has a proximal end connectable to at least one of the preheat chambers when in an installed position at a distal end of the preheat chamber. The loading station further includes a carrier for carrying the articles and a drive system. The drive system is positioned to move the carrier between: a loading/unloading position of the carrier in the loading station; a preheat position of the carrier in the preheat chamber to which the loading station is connected; and a deposition position of the carrier in the coating chamber. A gas source is connected to the preheat chamber.

In various implementations, the coating chamber may have at least one electron beam, and at least one crucible. The at least one preheat chamber may include a first preheat chamber and a second preheat chamber on opposite sides of the coating chamber. The at least one loading station may include a first pair of loading stations associated with the first preheat chamber and a second pair of loading stations associated with the second preheat chamber. For each preheat chamber, a proximal gate valve may separate such preheat chamber from the coating chamber. For each preheat chamber, a distal gate valve may be positioned at the distal end of the preheat chamber. At each loading station, a gate valve may be positioned at the proximal end of such loading station. The gas source may be an oxidizer source. A controller may be coupled to the coating chamber, the preheat chamber, and the gas source to control operation thereof.

Articles may be loaded into the carrier of at least one of the loading stations. Using the drive mechanism in such loading station, the carrier may be shifted to the preheat position. The articles may be preheated. Using the drive mechanism of such loading station, the carrier may be shifted to the deposition position from the preheat position. A coating may be deposited on the articles in the deposition position. There may be exactly two said preheat chambers. There may also be exactly two pairs of such loading stations, one pair associated with a first preheat chamber and the other pair associated with the other preheat chamber. The gas may be directed from the gas source to the preheat chamber. The direction of the gas may cause oxidation of an MCrAlY layer.

The details of one or more embodiments are set forth in the accompanying drawings and the description below. Other features, objects, and advantages will be apparent from the description and drawings, and from the claims.

BRIEF DESCRIPTION OF THE DRAWINGS

Like reference numbers and designations in the various drawings indicate like elements.

DETAILED DESCRIPTION

Figures 1, 2:
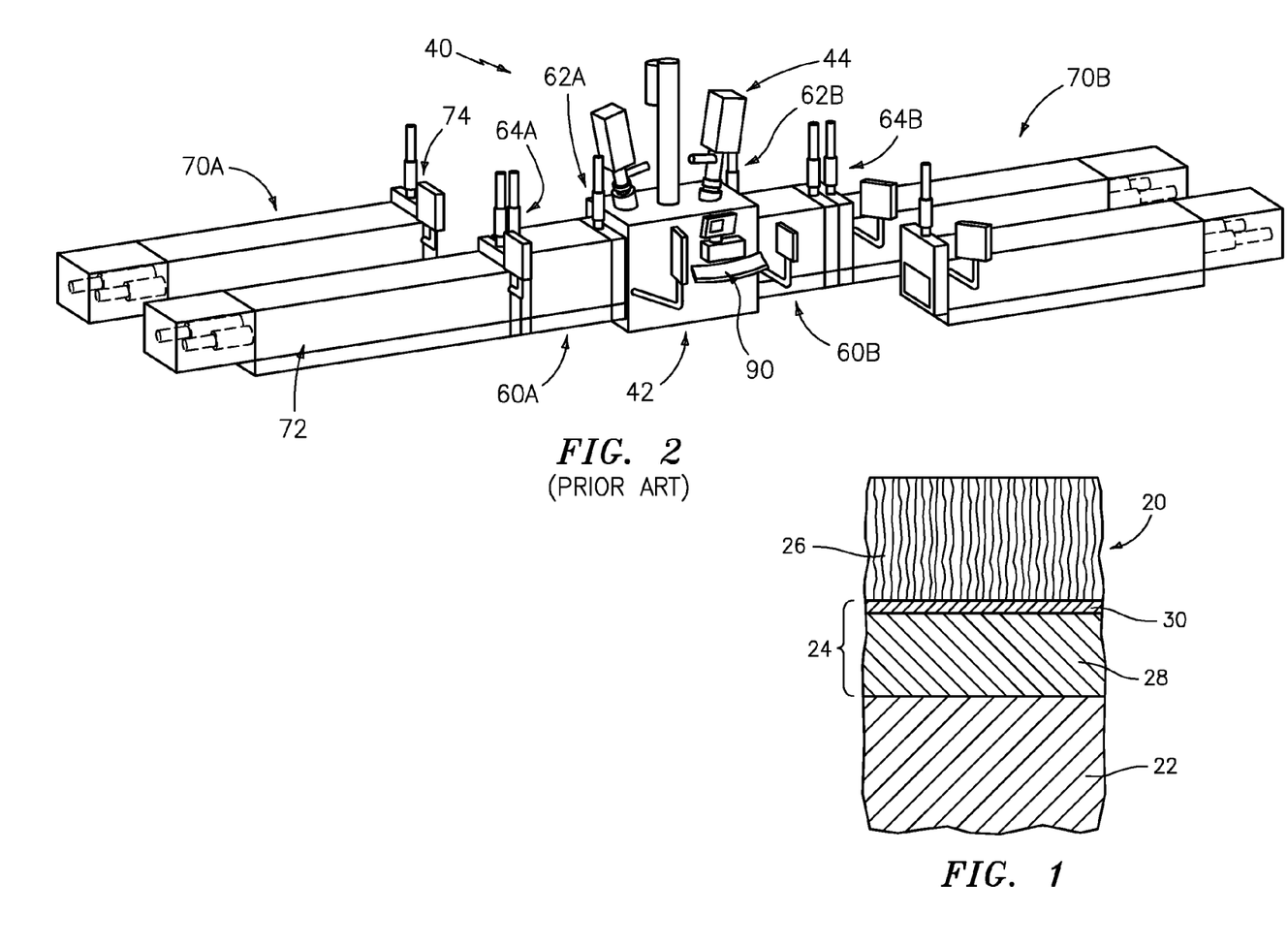
FIG. 1 is a partial schematic sectional view of a coated article.
FIG. 2 is a view of a prior art coating apparatus.
Figure 3:
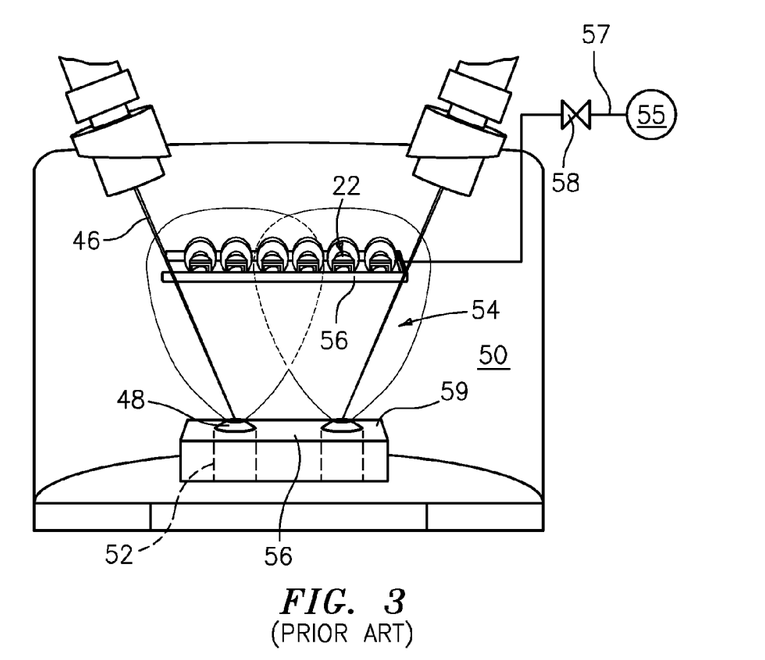
FIG. 3 is a further simplified view of a coating chamber of the apparatus of FIG. 2.

FIG. 1 shows a coating system 20 atop a superalloy substrate (the article/component/part that is coated) 22. The system may include a bond coat 24 atop the substrate 22 and a TBC 26 atop the bond coat 24. The exemplary bond coat 24 includes a base layer 28 and a TGO layer 30. Exemplary substrates are of nickel- or cobalt-based superalloys used for hot gaspath components such as: turbine section blades; turbine section vanes; turbine section blade outer air seals; combustor shell pieces; combustor heat shield pieces; combustor fuel nozzles; and combustor fuel nozzle guides. Exemplary base layer thicknesses are 10-400 micrometers, more narrowly 20-200 micrometers. Exemplary TGO layer thicknesses are 0.05-1 micrometers, more narrowly 0.1-0.5 micrometers. Exemplary TBC thicknesses are 40-800 micrometers, more narrowly 100-500 micrometers.

An exemplary coating process includes preparing the substrate (e.g., by cleaning and surface treating). A precursor of the bond coat is applied. An exemplary application is of an MCrAlY, more particularly a NiCoCrAlY material. An exemplary application is via a spray from a powder source. An exemplary application is via a high-velocity oxy-fuel (HVOF) process. An exemplary application is to a thickness of 0.003-0.010 inch, (76-254 micrometers) more broadly 0.001-0.015 inch (25-381 micrometers). LPPS, VPS, EBPVD, cathodic arc, cold spray, and any other appropriate process may be used.

After the application, the precursor may be diffused. An exemplary diffusion is via heating (e.g., to at least 1900° F. (1038 C) for a duration of at least 4 hours) in vacuum or nonreactive (e.g., argon) atmosphere. The exemplary diffusion may create a metallurgical bond between the bond coat and the substrate. Alternatively diffusion steps may occur after applying the TBC, if at all.

After application of the bond coat precursor, if any, the substrate may be transferred to a coating apparatus for applying the TBC 26. An exemplary coating apparatus is an EB-PVD coater.

FIG. 2 shows one exemplary EB-PVD coating apparatus/system (coater) 40 used in high volume production. The exemplary coater is based upon an existing system of ALD Vacuum Technologies GbmH, Hanau, Germany. The exemplary coater 40 includes a single central deposition or coating chamber 42. A pair of electron guns 44 are positioned at the chamber to each direct an associated electron beam 46 to a deposition material (or precursor thereof) source 48 in the chamber interior 50. Exemplary material sources 48 are respective bodies of ceramic-forming material each in an associated crucible 52. The exemplary material sources are ceramic bodies of the nominal TBC composition (e.g., a yttria-stabilized zirconia or a gadolinia-zirconia such as 7YSZ or 59 wt. % gadolinia, respectively). The electron beams vaporize the material to form vapor clouds 54 which envelop the articles or components 22 which are held in a coating position within the chamber 50. For introducing a reactive gas (e.g., oxygen for combining with the initially vaporated material in the vapor clouds to make up for oxygen lost from the evaporated ceramic) a gas source 55 may be provided. Exemplary gas is essentially pure oxygen. The source may be connected to an outlet (e.g., a manifold 56) via a gas line 57 and controlled by a gas valve 58. As is discussed further below, the same electron guns that vaporize the deposition material may be used to preheat the coating chamber (e.g., by directing their beams to a bed 59 of refractory ceramic gravel (e.g., also 7YSZ)).

Figure 4:
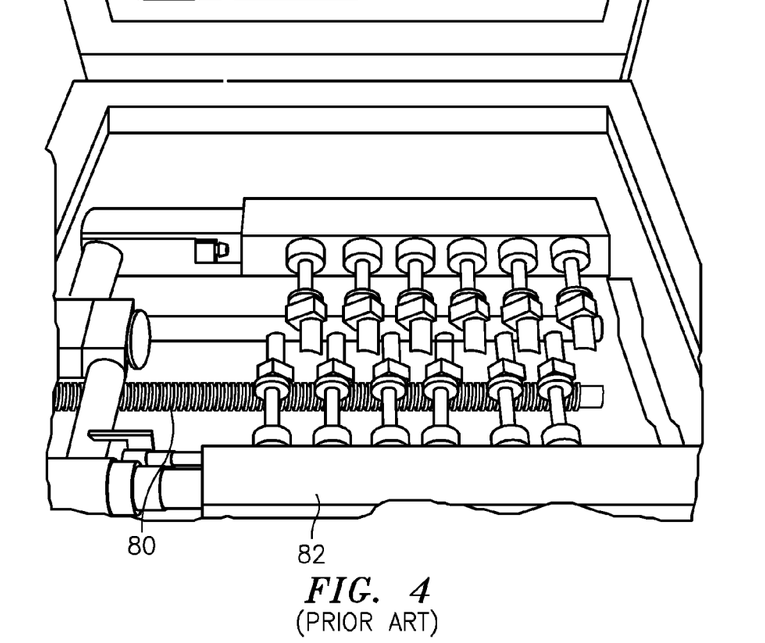
FIG. 4 is a view of a carrier and drive system of the apparatus of FIG. 2 through a loading port of a loading station.

For preheating the parts, the exemplary system 40 includes two preheat chambers (preheaters) 60 respectively positioned on opposite sides of the chamber 42. Respective gate valves 62A and 62B may be positioned at proximal ends of the respective preheat chambers 60A and 60B. Additional gate valves 64A and 64B may be at respective distal ends of the associated preheat chambers 60A and 60B. Groups of articles preheated within the chambers 60A and 60B may alternatingly be transferred to the coating chamber 42 for coating. As is discussed further below, this provides an efficient utilization of the chamber 42. For a similarly efficient use of each preheat chamber 60A, 60B, each preheat chamber is associated with a pair 70B, 70A, respectively, of loading chambers or stations 72. Each exemplary loading station 72 has a gate valve 74 at a proximal end thereof. The proximal ends may alternatingly be mated to the distal end of the associated preheat chamber. Each exemplary loading station 72 may have a carrier and drive system which, when the loading station is in its installed (operative or engaged) position and the appropriate gate valves are open, shift the carried articles into the associated preheat chamber or all the way into the coating chamber 42. FIG. 4 shows an exemplary carrier and drive mechanism having a screw drive mechanism 80 (e.g., electric motor driven) for longitudinally shifting a pair of carriers 82 (viewed through a loading/unloading port or top port 84) in the associated loading station. Each carrier 82 carries an associated group of the articles and includes an appropriate mechanism for rotating each of the articles about an associated axis (e.g., a transverse horizontal axis). The carrier may also rotate about the articles as a unit (e.g., about a longitudinal horizontal axis). Appropriate combinations of such rotations under automated control may provide coating uniformity.

Figure 5:
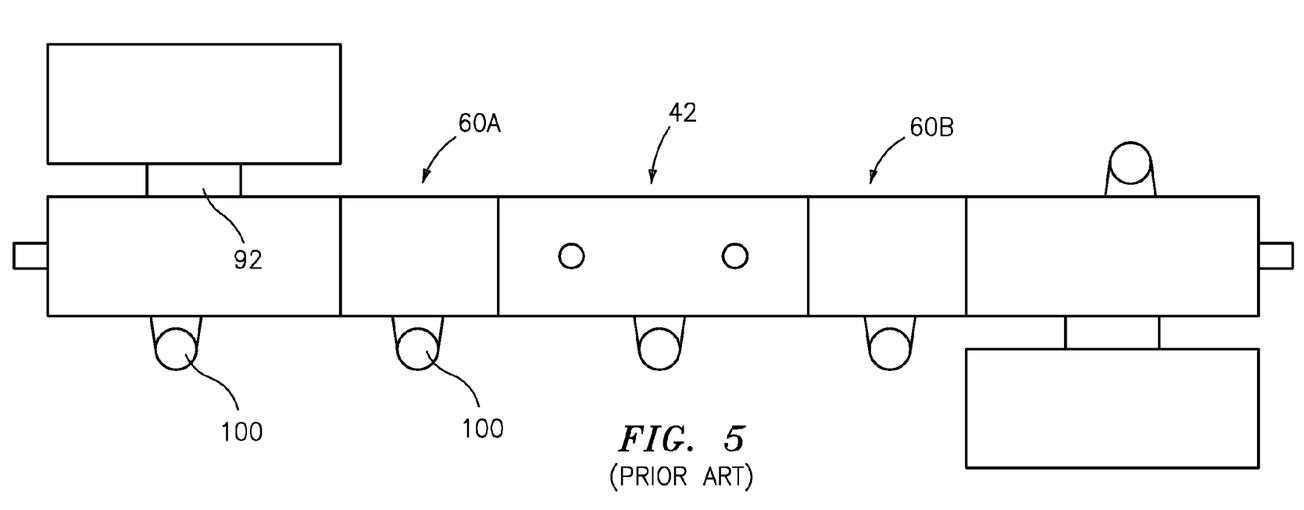
FIG. 5 is a top schematic view of the apparatus of FIG. 2.
Figure 6:
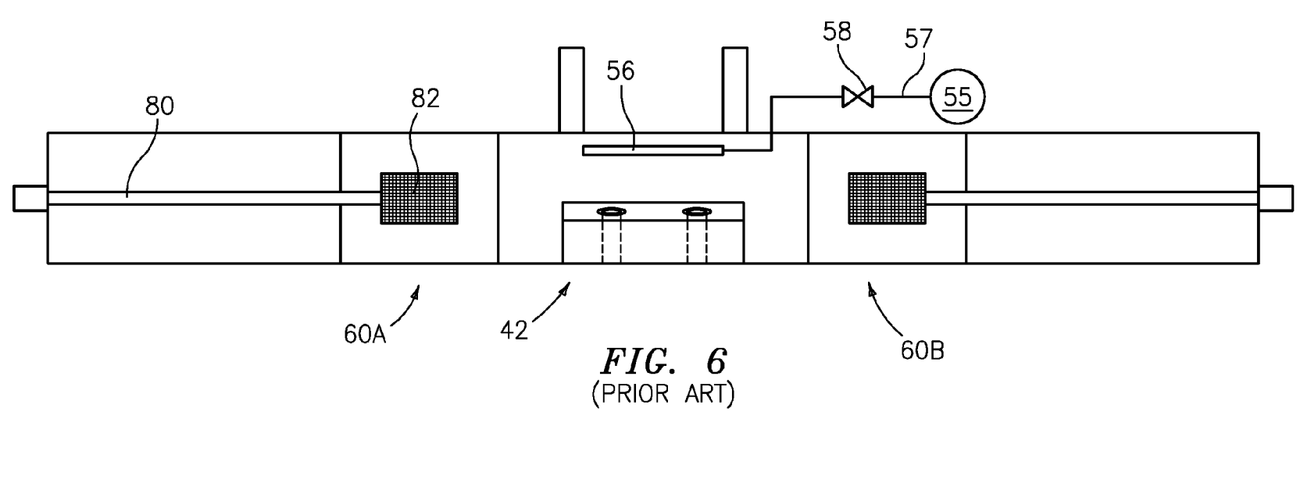
FIG. 6 is a side schematic view of the apparatus of FIG. 2.

A control system 90 may include an appropriately configured microcomputer, microcontroller, or other controller being configured by software and/or hardware to perform the methods described herein. The control system may be coupled to the various controllable system components as well as to sensors, input devices for receiving user input, and display devices. FIG. 5 schematically shows each pair of loading stations to have an associated transfer mechanism 92 for shifting the pair of loading stations between a first condition wherein a first of the loading stations is in the operative position aligned with (to mate to) the associated preheat chamber and a second (disengaged loading/unloading) position, clear of the preheat chamber. In the exemplary implementation, the second position for one of the loading stations is to one side of the operative position while the second position of the second loading station is to the opposite side of the operative position. In the second position, the uncoated articles may be loaded into the loading station and the coated articles removed therefrom (e.g., through the associated top port (if present) or gate valve). FIG. 5 also shows vacuum sources 100 which may be respectively associated with each of the chambers and each of the loading stations. Alternatively, vacuum sources may be more highly combined.

The structure so far described corresponds to an exemplary baseline prior art system relative to which modifications are discussed below. In an exemplary baseline method of operation, a given loading station may initially be in its disengaged position and empty. The top port is open and the loading station interior is subject to ambient room temperature and ambient room air. The parts are loaded to the carrier and the top port closed. When the associated engaged position is available (e.g., after the other loading station of the pair is shifted away therefrom) the loading station is shifted into the engaged position. The loading station interior is then pumped down to vacuum (if not already done). Once vacuum is reached, the associated loading station gate valve and preheat chamber distal gate valve are opened and the carrier transfers the parts into the interior of the preheat chamber. The preheat chamber interior may previously have been pumped to vacuum. The parts are first heated to an intermediate temperature (e.g., of a particular target temperature in the range of 1000-2000° F. (538-1093 C)). Exemplary heating is performed by graphite heating elements (not shown) within the preheat chamber. When the coating chamber is available (e.g., after parts have been removed from the opposite side), the parts are then transferred to the coating chamber. Prior to transfer, the preheat chamber may briefly heat the parts to a second temperature higher than the first temperature (e.g., in the range of 1800-2000° F. (982-1093 C)). The carrier transfers the parts to the coating chamber after opening of the associated gate valve 62A or 62B. When the parts enter the coating chamber, there may be a continuous oxygen flow from the source 55. The parts may be maintained at or near the second temperature for the duration of the deposition process. After deposition is complete, the parts may be retracted (by the carrier drive mechanism) back to the preheat chamber and the gate valve 62A or 62B closed, thereby freeing up the coating chamber to receive parts from the opposite side. The coated parts may be kept in the preheat chamber for a sufficient time to cool down (e.g., with the heating element off). Thereafter, the parts may be retracted back into the loading station and the valves 74 and 64A or 64B closed. The loading station may be vented to atmosphere and shifted to its disengaged position.

As is discussed further below, the present disclosure may modify such an apparatus and process to pre-oxidize the bond coat prior to the EB-PVD deposition. This may result in improved TGO properties and improve overall coating properties. The pre-oxidation may be performed in the preheat chambers.

Figure 7:
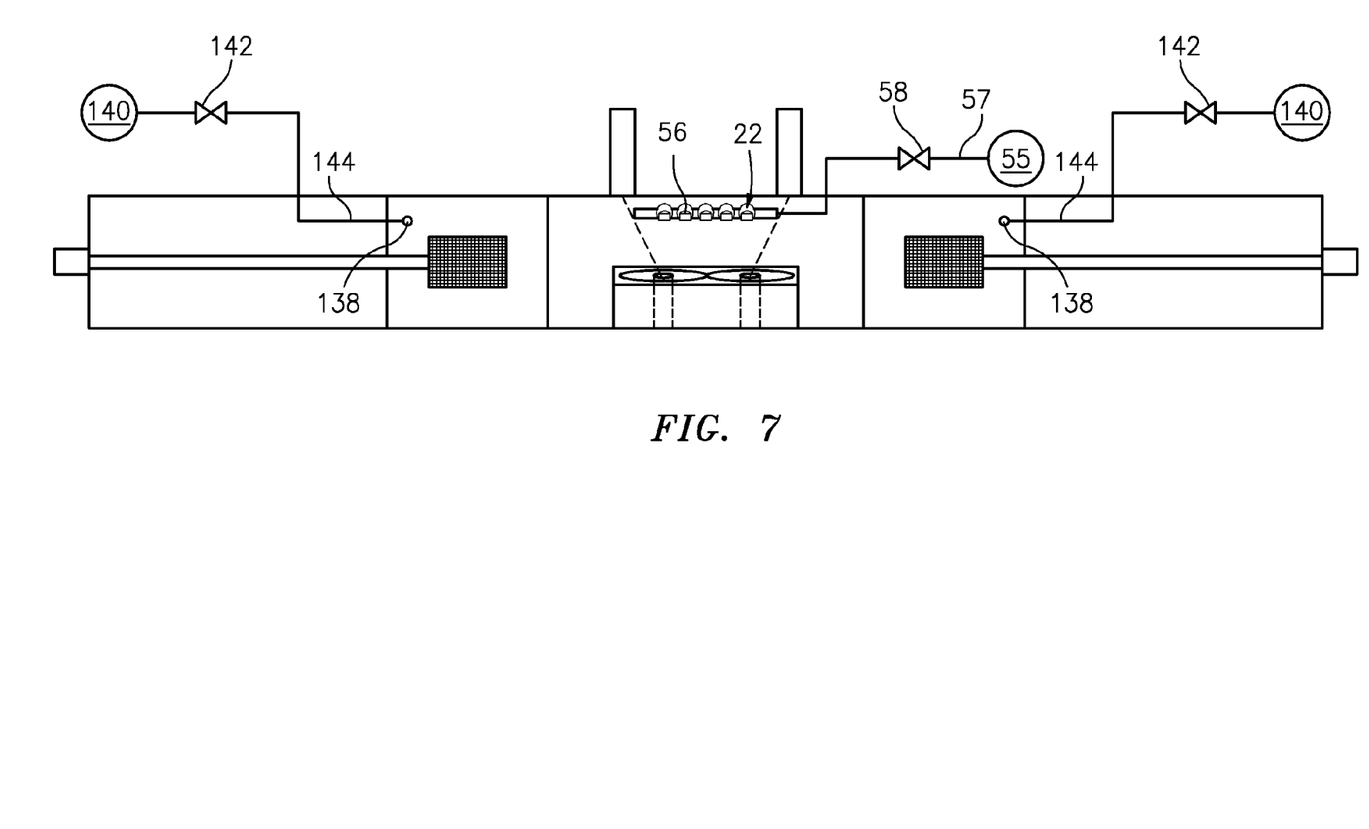
FIG. 7 is a side schematic view of a modified apparatus.

FIG. 7 shows each preheat chamber 60A and 60B as being modified with a port 138 for receiving a reactive gas from a source 140 under the control of a valve 142 along a gas line 144. The valve may be controlled by the control system. The exemplary reactive gas is an oxidizer, an exemplary oxidizer being essentially pure oxygen. More broadly, the oxidizer could be at least 50% oxygen, by volume. Relative to the prior art, use of the sources 140 can shift TGO formation to an earlier stage in the deposition process. Specifically, it may allow the TGO to be substantially formed during the preheating in the preheat chambers rather than in the coating chamber.

The basic process may proceed as described above regarding the prior art. One example of processing in the preheat chamber involves a rapid non-oxidative preheat followed by oxygen introduction and oxidation. The non-oxidative nature of the preheat may be assisted by a pre-flush of the preheat chamber (and/or the loading station) with inert gas prior to vacuum pumpdown. Heating involves a rapid heating to a temperature of about 1000 C. Once this relatively high temperature is reached, oxygen may be introduced from the source 140 via automated control of the valve 142. The oxygen flow promotes TGO growth. Specifically, the quick non-oxidative ramp up followed by high temperature oxygen exposure is believed to help form the TGO as a single phase alpha alumina scale which may have good mechanical and chemical interaction with the remaining bond coat and with the TBC. At lower temperatures, it is believed that non-desirable components may form including theta and gamma forms of alumina, spinels, and various nickel and chrome oxides (e.g., in the 1000-1800° F. (982-1093 C) range).

After the oxygen has flowed sufficiently for a desired TGO growth, the oxygen flow may be cut off and the preheat chamber pumped to vacuum (with optional inert gas purge). This helps minimize oxidation of the graphite heating elements. The parts may then be transferred to the coating chamber as discussed above. The preheat chamber heating elements may be shut off if they have not already been. The parts thus enter the heating chamber with the TGO largely preformed (e.g., at least half of the ultimate post-coating oxidation will have occurred).

Among other variations, we have determined that, when the same electron gun is used for both deposition and coating chamber preheat, the coating chamber preheat may be at too high a power density. This is distinguished from other prior art systems wherein a low power gun is used for preheating and a high power gun is used for deposition. Thus, multiple modes may be provided for using the same gun(s) for deposition and for preheating and temperature maintenance. FIG. 7 shows the guns as configured to provide a relatively large spot 150 with correspondingly low power density in a temperature maintenance mode. This provides greater flexibility in use of the electron guns to preheat or reheat the material.

During a preheat or reheat stage of the coating chamber, an exemplary power density of 0.1-0.3 kilowatt per square inch (0.06-0.19 watts per square meter (W/m$^2$)) (more broadly 0.1-0.5 kilowatt per square inch (0.06-0.32 W/m$^2$) or less than 0.4 kilowatt per square inch (0.26 W/m$^2$) may be applied. This results in none or negligible evaporation of material. By way of contrast to achieve similar powers (and thus similar heating) a smaller prior art beam spot would require a higher density (e.g., 0.5-2.0 kilowatt per square inch (0.32-1.3 W/m$^2$) which risks evaporation and depositing on parts which have not yet reached the optimum temperature. By way of contrast, an exemplary power density during deposition (in either the baseline or modified system) is at least five (e.g., 5-10) kilowatts per square inch (3.2-6.5 W/m$^2$). During deposition, the beams bay be narrowed (via their focusing hardware (e.g., focusing and scan coils)) to increase power density at a given power output to focus energy onto the ingots.

It may also be desirable to minimize leak rates. Leakage can contribute to the formation of detrimental oxides. For example, as noted above, during an initial preheat stage, the presence of oxygen results in some leakage may contribute to the formation of non-desirable phases instead of the desired alpha alumina.

Figure 8:
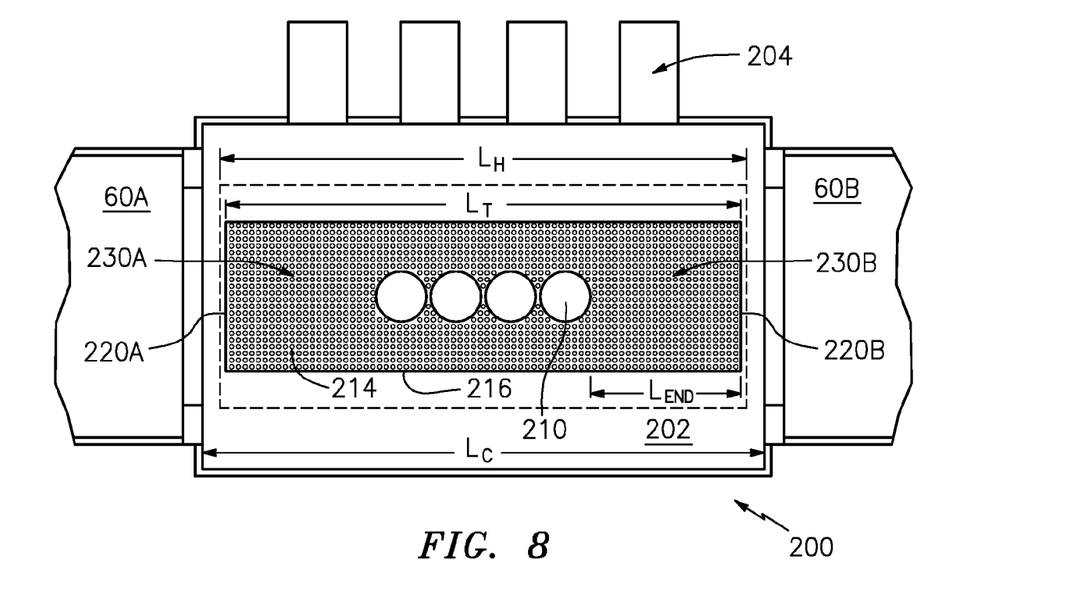
FIG. 8 is a top schematic/cutaway view of an alternate coating chamber.
Figure 9:
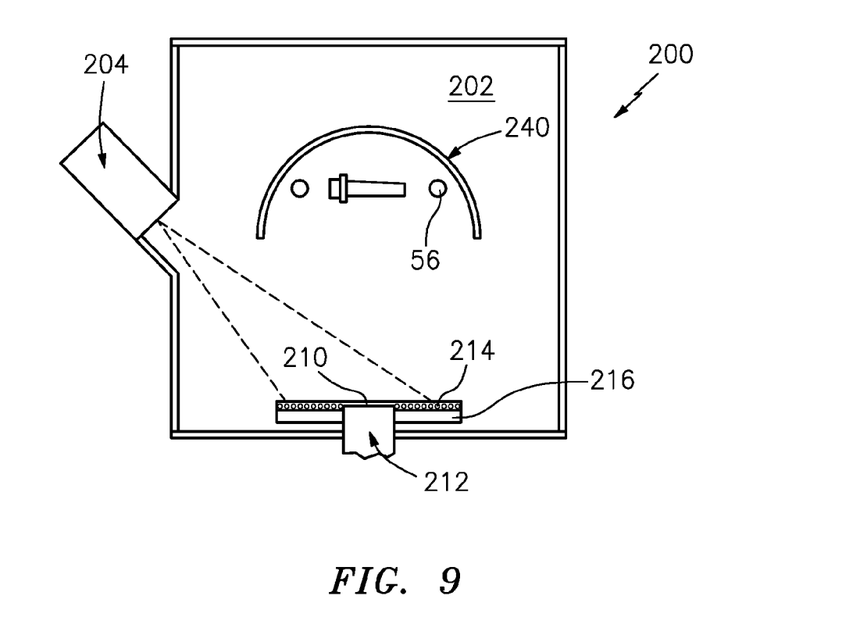
FIG. 9 is an end schematic/cutaway view of the chamber of FIG. 8.

FIGS. 8 and 9 show an alternate coating chamber 200 having an interior 202. A plurality of EB guns 204 are positioned along a sidewall of the chamber. The EB guns are positioned to heat upper surfaces 210 of ingots 212 and a surface of a ceramic bed 214 (e.g., zirconia) in a thermal tray 216 (e.g., water-cooled copper). The exemplary system has four ingots and four guns. The exemplary thermal tray extends between opposite ends 220A and 220B. An exemplary length $L_T$ of the tray is close to an overall length $L_C$ of the chamber interior (e.g., at least 70%, more narrowly at least 80% or at least 90%). This leaves relatively long end areas 230A and 230B of the ceramic bed between the associated outboard ingot and the end of the chamber (and the adjacent junction to the preheat chamber 60A or 60B). This extra length ($L_{LEND}$, e.g., at least about 10% of $L_T$, more narrowly at least 20% or at least 25%) helps maintain part and chamber temperature as the parts are transferred into and out of the chamber 200. A thermal hood (e.g., a partial circular cylindrical shell of a material such as a nickel-based superalloy (e.g., Inconel) 240 may have a similar length $L_H$. A hood liner (not shown) may be of a mesh of similar material concentrically within the hood. The exemplary guns 204 are positioned to heat the end areas 230A and 230B at similar rates to inboard areas around the ingots. The exemplary guns are positioned to be able to, in combination, sweep the entire bed or essentially the entire bed (e.g., 95% of length and width). Furthermore, the exemplary guns are positioned to be able to heat the bed while parts are in place and while parts are being moved (e.g., with all guns active at the same overall power output but lower density than in the deposition/coating mode).

Figure 10:
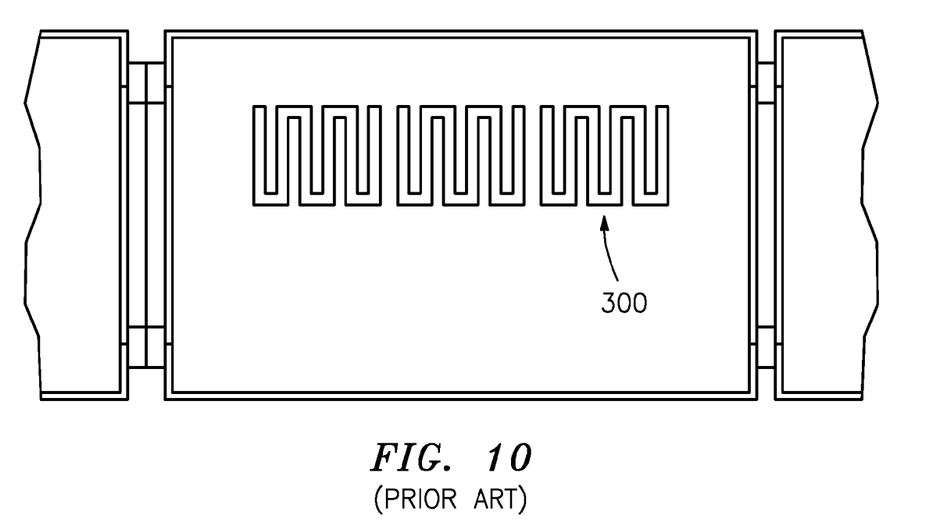
FIG. 10 is a side schematic/cutaway view of a prior art preheat chamber.
Figure 11:
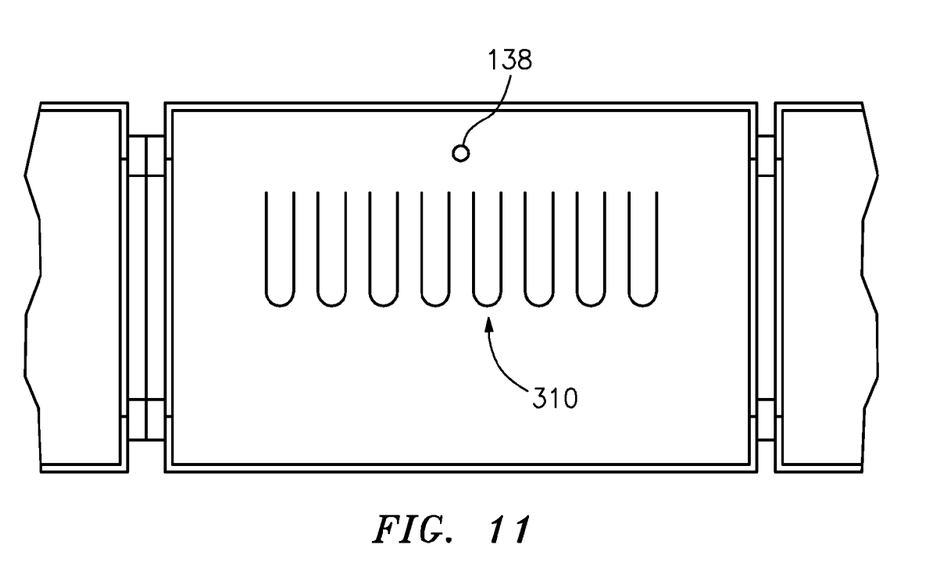
FIG. 11 is a side schematic/cutaway view of an alternate preheat chamber.

Yet further heating may be provided in the preheat chambers. FIG. 10 shows an exemplary prior art group of three carbon heating elements 300 along a sidewall of the chamber. FIG. 11 shows a group (e.g., a linear array) of molybdenum disilicide resistive heating elements 310 on the sidewall. Such elements 310 may be positioned on one sidewall, two sidewalls, and/or top and bottom walls. Individual elements or groups of elements may create separately controllable zones (e.g., at least three zones) progressively between the proximal and distal ends of each preheat chamber. They allow improved control over temperature distribution of the parts during preheating. The exemplary molybdenum disilicide elements are U-shaped elements (e.g., suspended on lateral walls). These elements may have advantages of oxidation resistance and thermal response.

Figure 12:
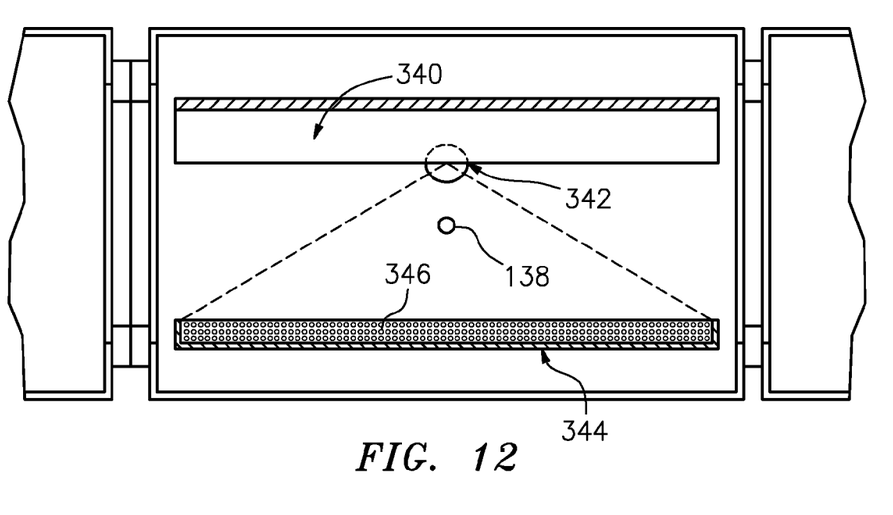
FIG. 12 is a side schematic/cutaway view of a second alternate preheat chamber.

FIG. 12 shows an alternate preheat chamber with an exemplary thermal hood 340 (e.g., a partial circular cylindrical shell of a material such as a nickel-based superalloy (e.g., Inconel) without a liner), one or more electron beam guns 342, and thermal tray 344 (having a ceramic bed 346 (e.g., of 7YSZ or zirconia or other high temperature, oxygen-compatible, low vapor pressure material) similar to that of a coating chamber but lacking ingots). The exemplary one or more electron beam guns 342 are positioned to be able to scan essentially the entire thermal tray at a power density similar to that of the coating chamber. The exemplary one or more electron beam guns are positioned to scan the tray with the parts/substrates in the preheat chamber, with the parts/substrates having past beyond the preheat chamber to the coating chamber, and with the parts/substrates having been retracted from the preheat chamber and during movement between these stages. This may have advantages of good compatibility with a wide variety of chemical and thermal environments (e.g., as distinguished from some resistive or other heating elements which may have narrower compatibilities). Additionally, an externally mounted gun may be easier to service than internally mounted heating elements.

Where Si units are provided in a parenthetical after English units, the Si units represent a conversion of the English units which are regarded as controlling.

One or more embodiments have been described. Nevertheless, it will be understood that various modifications may be made. For example, and applied as a reengineering of an existing coating apparatus and process, details of the existing apparatus and/or process (in view of the particular coating and substrate) may influence or dictate details of any particular implementation. Accordingly, other embodiments are within the scope of the following claims.

What is claimed is:

1. A coating apparatus for coating articles, the coating apparatus comprising:
   a coating chamber for coating the articles and having at least one electron beam gun and at least one crucible;
   at least one preheat chamber coupled to the coating chamber and comprising:
      at least one thermal bed;
      at least one electron beam gun positioned to direct an electron beam to the at least one thermal bed; and
      at least one thermal hood;
   a gas source connected to the preheat chamber;
   at least one loading station having:
      a proximal end connectable to at least one of the preheat chambers when in an installed position at a distal end of said preheat chamber;
      a carrier for carrying the articles;
      a drive system positioned to move the carrier between:
         a loading/unloading position of the carrier in the loading station;
         a preheat position of the carrier in the preheat chamber to which the loading station is connected; and
         a deposition position of the carrier in the coating chamber.

2. The apparatus of claim 1 wherein:
   the at least one preheat chamber includes a first preheat chamber and a second preheat chamber on opposite sides of the coating chamber.

3. The apparatus of claim 2 wherein the at least one loading station includes:
   a first pair of loading stations associated with the first preheat chamber and a second pair of loading stations associated with the second preheat chamber.

4. The apparatus of claim 1 wherein:
   for each preheat chamber, a proximal gate valve separates said preheat chamber from the coating chamber;
   for each preheat chamber, a distal gate valve is positioned at the distal end of said preheat chamber; and
   for each loading station, a gate valve is positioned at the proximal end of said loading station.

5. The apparatus of claim 1 wherein:
   the gas source is an oxidizer source.

6. the apparatus of claim 5 wherein:
   the gas source is directly connected to the preheat chamber.

7. The apparatus of claim 1 further comprising:
   a controller coupled to the coating chamber, the preheat chamber, and the gas source to control operation thereof.

8. The apparatus of claim 1 wherein:
   the gas source is directly connected to the preheat chamber.

9. the apparatus of claim 1 wherein:
   the thermal bed comprises ceramic gravel.

10. the apparatus of claim 9 wherein:
    the thermal bed comprises said ceramic gravel in a tray.

11. the apparatus of claim 9 wherein:
    the thermal hood comprises a nickel-based superalloy.

12. the apparatus of claim 1 wherein:
    the thermal hood comprises a nickel-based superalloy.

13. the apparatus of claim 1 wherein:
    the thermal hood comprises a nickel-based superalloy partial cylindrical shell.

14. A method for using the apparatus of claim 1, the method comprising:
    loading articles into the carrier of at least one of the loading stations;
    using the drive mechanism of said loading station to shift said carrier to the preheat position;
    preheating the articles;
    using the drive mechanism of said loading station to shift said carrier to the deposition position from the preheat position; and
    depositing a coating on the articles in the deposition position.

15. The method of claim 14 wherein:
    all said electron beam guns of the coating chamber remain active during the shift.

16. The method of claim 14 wherein:
    there are exactly two said preheat chambers; and
    there are exactly two pairs of said loading stations, a first pair associated with a first of the preheat chambers and a second pair associated with a second of the preheat chambers, in each pair, the loading stations being shiftable between a position engaged to the preheat chamber and a position disengaged from the preheat chamber.

17. The method of claim 14 further comprising:
    directing gas from the gas source to the preheat chamber.

18. The method of claim 17 wherein:
    the directing of the gas is effective to cause a majority of an oxidation of a bond coat layer in the final post-depositing article.

19. The method of claim 14 wherein:
    the at least one crucible contains a coating precursor material; and
    the at least one electron beam gun is used to preheat the coating precursor material at a power density of 0.1-0.5 kilowatt per square inch (0.06-0.32 W/m$^2$).

* * * * *